United States Patent
Kennedy et al.

(10) Patent No.: US 6,931,333 B2
(45) Date of Patent: Aug. 16, 2005

(54) ELECTRICAL POWER SENSING

(75) Inventors: Leslie William Kennedy, Aylesbury (GB); Anthony Alan Lane, Northampton (GB)

(73) Assignee: Bookham Technology PLC, Oxforshire (GB)

( * ) Notice: Subject to any disclaimer, the term of this patent is extended or adjusted under 35 U.S.C. 154(b) by 0 days.

(21) Appl. No.: 10/147,306

(22) Filed: May 17, 2002

(65) Prior Publication Data

US 2003/0216878 A1 Nov. 20, 2003

(51) Int. Cl.$^7$ .................. G01R 25/00; G01R 27/00; G06F 19/00
(52) U.S. Cl. ................................................ 702/65
(58) Field of Search .......................... 702/60–62, 65, 702/116, 117, 130–136; 324/72, 72.5, 96, 105; 340/600; 343/700 R, 703; 136/224, 225

(56) References Cited

U.S. PATENT DOCUMENTS 5,302,024 A * 4/1994 Blum ........................ 374/122
5,565,763 A * 10/1996 Arrendale et al. ......... 323/360
6,518,743 B1 * 2/2003 Kodato ....................... 324/95

FOREIGN PATENT DOCUMENTS

GB          2 374 942      * 10/2002

* cited by examiner

Primary Examiner—Michael Nghiem
(74) Attorney, Agent, or Firm—Fleshner & Kim, LLP

(57) ABSTRACT

The RF power passing through a given position in a monolithic microwave integrated circuit (MMIC) is determined using the Seebeck effect. The MMIC includes at least certain components of a voltage creating circuit, including a first Seebeck junction on the MMIC at a given position and a second Seebeck junction at a different position. The voltage generated between the two junctions as a result of differential heating caused by the passage of RF power through the given position is measured with a voltmeter. By calibration, the RF power is related to a measured Seebeck voltage created when the circuit is in operation and hence can be determined. The Seebeck circuitry may be independent of the MMIC circuitry or be integrated into the active circuitry of the MMIC itself.

20 Claims, 3 Drawing Sheets

ELECTRICAL POWER SENSING

The invention relates to electrical power sensing and has particular reference to sensing radio frequency (RF) power in monolithic microwave integrated circuits (MMIC).

BACKGROUND TO THE INVENTION

It is very often highly desirable to be able to measure electrical power at one or more points in an MMIC. This can be used to control the gain of an active component such as a transmitter or amplifier. It can also be used in diagnostic work or in test evaluation work.

It is often not sufficient merely to know the current passing through a point in the circuit but also the actual power. It is particularly difficult to measure the RF power where the frequency of operation of the circuit is in the range of 1 to 100 Gigaherz (GHz). If the circuit is a resistive circuit the voltage and current will be in phase, but if the circuit is a reactive circuit the power and the current will be out of phase.

Typically it might be required to measure the power over a time interval of 1 millisecond (1 thousandth of a second) and in that time a circuit operating at 50 GHz will have experienced fifty million cycles, and the instantaneous power may vary up and down during those 50 000 cycles.

In apparatus such as power amplifiers oscillators, modulators, mixers, radio data transmission equipment and telecommunications links there has been no practical method of measuring RF power in an MMIC.

In larger circuits it has been possible to tap off a portion of the signal with a coupler and measure the power going through the coupled circuit. However for a coupler to work properly, it has to be a considerable number of wavelengths long, otherwise it is not detecting and coupling with a representative signal. It also uses some of the power of the circuit so is wasteful.

In practise therefore there have been no practical methods of accurately measuring RF power in MMIC's.

BRIEF DESCRIPTION OF THE INVENTION

By the present invention there is provided a method of determining the RF power passing through a given position in a monolithic microwave integrated circuit (MMIC) which comprises the steps of establishing on the MMIC at least certain components of a voltage creating circuit, including a first Seebeck junction on the MMIC at the given position and a second Seebeck junction at a different position, measuring the voltage generated between the two junctions as a result of differential heating caused by the passage of the RF power through the given position and by calibration relating the RF power to a measured Seebeck voltage created when the circuit is in operation.

Preferably the second Seebeck junction and the first Seebeck junctions are at thermal eqilibrium when the RF power at the given point is zero.

The MMIC is preferably a gallium arsenide (GaAs) MMIC and the Seebeck junction has one of the materials of the junction doped GaAs. The implant may be a n-type or p-type. The other material of the junction may be TaN. Alternatively the base material of the MMIC may be InP.

Although the invention can work across a wide range of frequencies, the preferred range is 2 GHz to 100 GHz further preferably 5 GHZ to 70 GHz and yet further preferably from 10 to 30 GHz.

BRIEF DESCRIPTION OF THE DRAWINGS

Embodiments of the present invention will now be described with reference to the accompanying drawings, of which.

EXAMPLES OF THE INVENTION

In its essence the invention monitors the RF power passing through a given point in the circuit by measuring the temperature rise at that point utilising the Seebeck effect.

The Seebeck effect is that a current will flow around a closed circuit made of two dissimilar metals if the junctions between the metals are maintained at different temperatures. If such a circuit is broken between the junctions then a voltage will be established between the broken ends. The voltage is a function of the temperature difference between the junctions.

The invention effectively locates one junction of the Seebeck couple at the point where the RF power is to be measured and this detects the variation in the heat generated in the circuit through which the RF signal is passing. The thermal output is a measure of the average power passing through the point and thus the Seebeck voltage is also an average.

GaAs is a very poor conductor of both heat and electricity The GaAs circuits themselves require dopants in certain, regions to make them work, and similarly the GaAs for the one component of the Seebeck junction is also doped to render it conducting. However fortuitously the components of the junction can be grown on and integrated into the GaAs MMIC structure without creating stresses in the structure which would cause it to fail in use. By utilising the invention on GaAs MMICs the invention also takes advantage of the low thermal conductivity of the base GaAs material which means that the junction is sufficiently insulated thermally from its surroundings so as to be able to have a temperature rise dependant on the power flowing through the circuit just "beneath" the junction.

Figure 1:
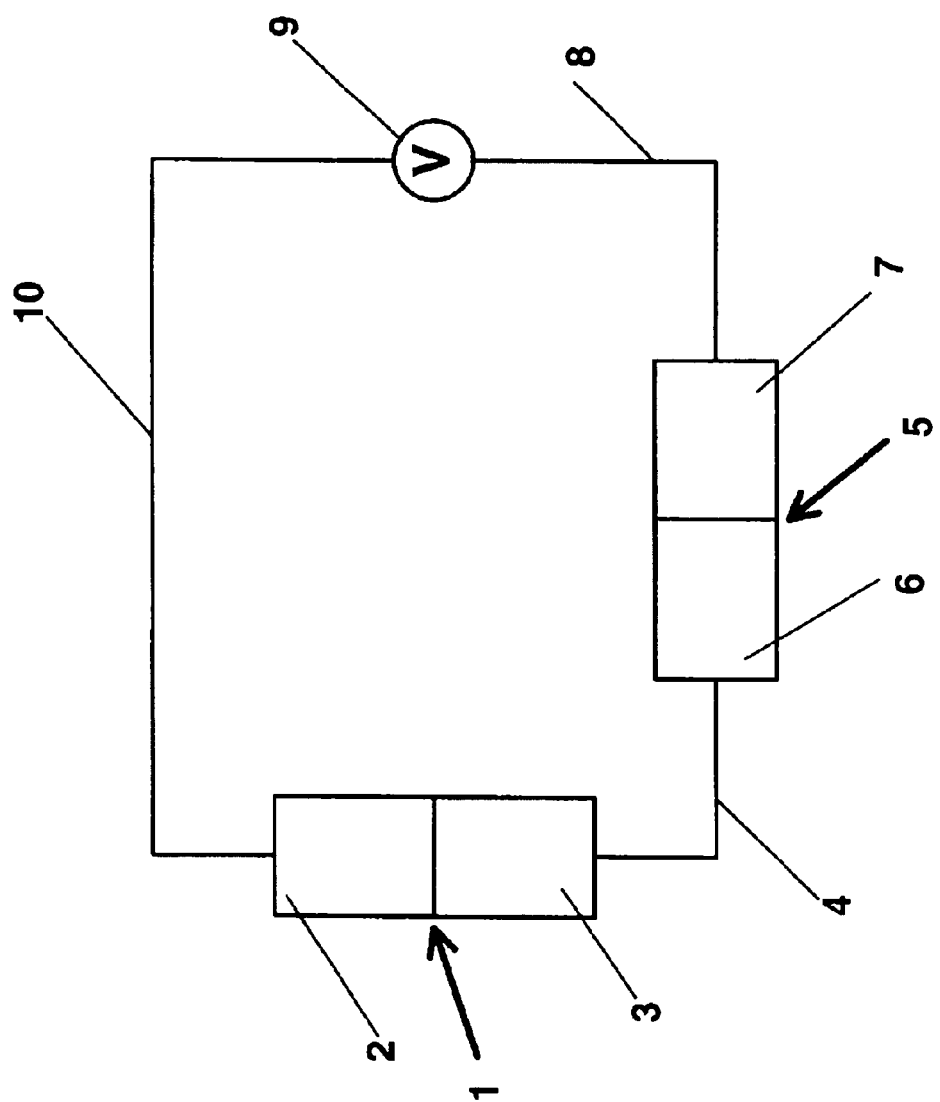
FIG. 1 is a diagram of one embodiment of the invention.

FIG. 1 illustrates the simplest form of the device of the invention. A first junction 1 made by the contact between a doped GaAs conductor 2 and a TaN conductor 3, is electrically connected via line 4 to a second junction 5. In the second junction the component 6 is also TaN and the component 7 is doped GaAs. A conductor 8 leads to a voltmeter 9 and the circuit is completed by a conductor 10 which is connected to component 2.

The junctions 1 and 5 are located on the MMIC as near as possible at ambient temperature when no power is passing beneath junction 1 so the temperature of both junctions is substantially the same and both will be at the ambient temperature of the MMIC. However if junction 1 is located at a location where it is desired to measure the RF power passing through the position, then when such RF power passes through it will cause local heating and generate a Seebeck voltage. By measuring this and calibrating the measured voltage against known powers then the apparatus can be calibrated and used to determine an unknown power.

Figure 2:
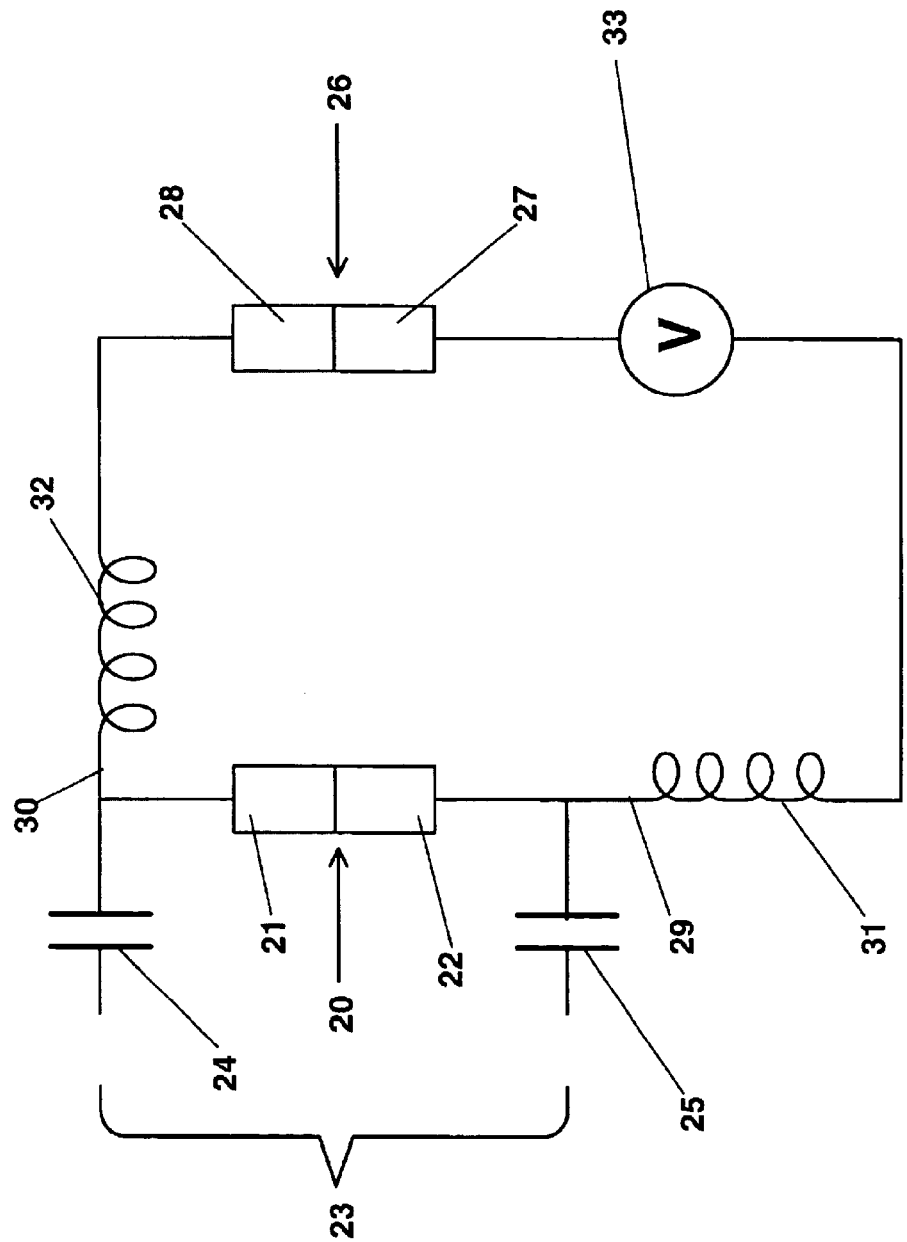
FIG. 2 is a diagram of a second embodiment of the invention.

The embodiment of the invention illustrated in FIG. 1 has all of the components of the Seebeck circuit independent of the circuitry of the MMIC itself. However it is also possible to integrate the Seebeck circuitry into the active circuitry of the MMIC as is shown in FIG. 2. In FIG. 2 the first of the Seebeck junctions 20 formed between dissimilar conductors 21 and 22 is an integral part of the MMIC circuit 23. A pair of capacitors 24 and 25 prevents the flow of DC current through the Seebeck junction 20.

The second Seebeck junction 26 is formed between dissimilar conductors 27 and 28. The two junctions are interconnected by lines 29, 30, which have inductive coils 31 and 32 to prevent the flow of RF currents through the reference junction. The voltmeter 33 completes the circuit and is used to measure the voltage developed in the circuit in use. Again the junctions 20 and 26 are mounted on or integrated into an MMIC as near as possible on the same isotherm when the amount of power to be measured by the temperature rise at junction 20 is zero. This again means that any temperature rise in the junction, in use, is caused by local heating generated by the power passing through the junction 20.

Figure 3:
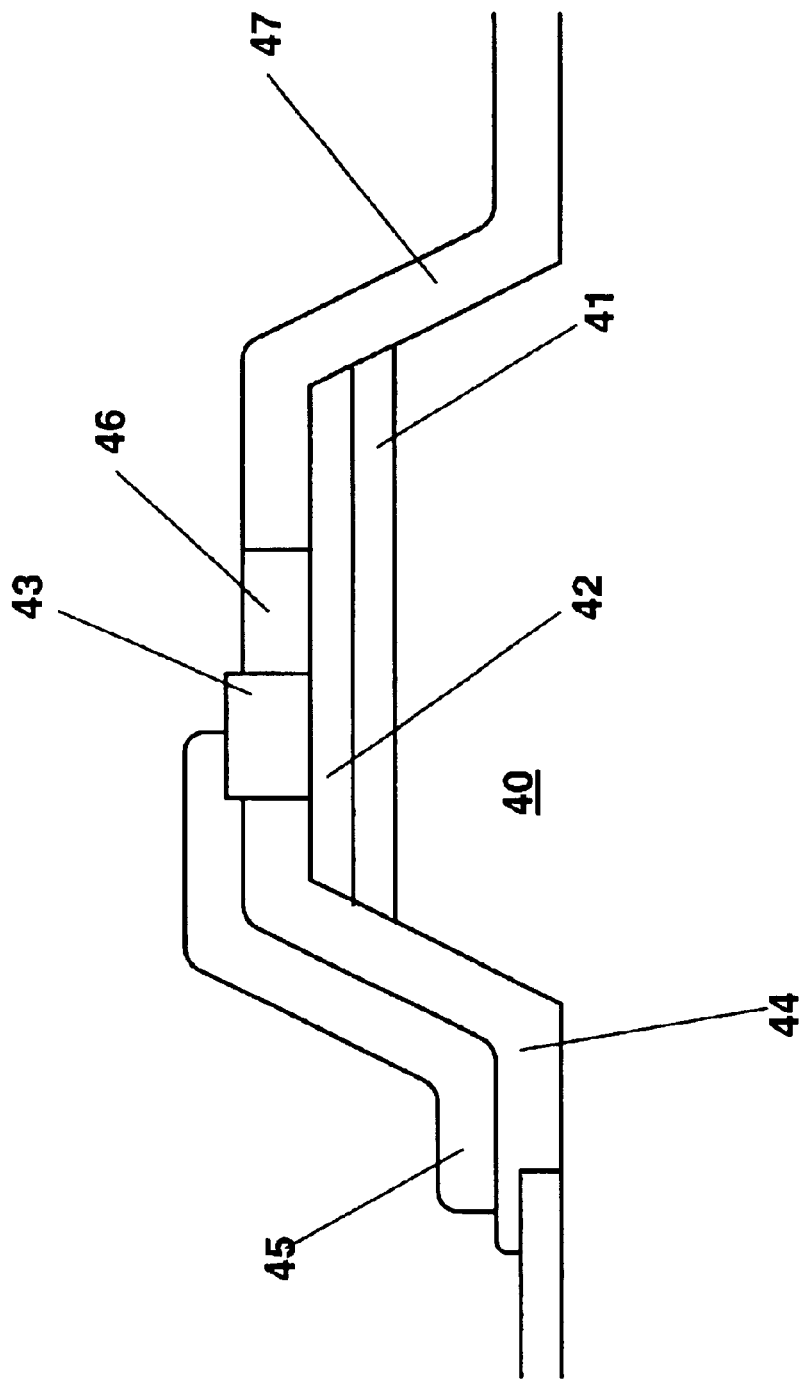
FIG. 3 is a sectional view of one junction of the invention on a MMIC.

FIG. 3 illustrates an integrally formed Seebeck junction on a GaAs based MMIC. The body 40 of the MMIC has located on its surface in a conventional manner a thin layer of AlGaAs 41 as a consequence of the construction of other parts of the MMIC which in this particular case is a field effect transistor. It plays no part in the operation of the Seebeck junction. A layer 42 of GaAs is then applied to from one side of a one of the Seebeck junctions. A layer 43 of TaN is then located on the GaAs layer 42 to form the actual Seebeck junction. An insulating layer of SiN or polyimide 44 insulates the substrate 40 and the GaAs layer 42 from a conductor 45 which makes electrical contact with the TaN junction component 43. The insulation 46 also separates the metal conductor 47 from the TaN 43 but makes contact with the GaAs junction component 42. Thus conductors 45 and 47 are in electrical contact with the opposite sides of the single Seebeck junction between components 42 and 43.

The junction can be built up using conventional monolithic processing techniques namely photoresist, masking and etching techniques. It is a major advantage of the present invention that it can be put into effect using conventional MMIC construction techniques.

It is particularly useful to use the invention in MMIC's based on GaAs technology because GaAs has such a low thermal conductivity that the junctions can be relatively close to one another and the amount of heat that will travel from one to the other can be sufficiently low as to make the use of the Seebeck effect a practical possibility. It will also be appreciated that it is preferred that the two junctions be on the same isotherm when no RF power is passing through the area of the junction carrying out the measurement. However this is not essential and the other junction can be at a constant temperature or at a variable temperature as long as calibration can be effected for measurement in real operation.

In operation the MMIC is operated with no RF power passing through the location where the measurement is to be made and the voltage generated in the Seebeck circuit is measured. The power levels are then increased in a known manner and the new voltages measured and thus the power can be calibrated against voltage rise which corresponds to temperature increase.

To increase tide voltage output more Seebeck junctions can be used in series, and to increase the power output of the Seebeck circuit a greater area of Seebeck junction is provided.

What is claimed is:

1. A method of determining RF power passing through a given position in a monolithic microwave integrated circuit (MMIC) which comprises the steps of establishing on the MMIC at least certain components of a voltage creating circuit, including a first Seebeck junction on the MMIC at said given position and a second Seebeck junction at a different position, measuring the voltage generated between the two junctions as a result of differential heating caused by the passage of the RF power through said given position and by calibration relating the RF power to a measured Seebeck voltage created when the circuit is in operation, wherein the MMIC is a gallium arsenide (GaAs) MMIC, and the Seebeck junction has one of the materials of the junction doped GaAs.

2. A method as claimed in claim 1 in which the second Seebeck junction and the first Seebeck junction are on the same isotherm when the RF power at the given point is zero.

3. A method as claimed in claim 1 in which the doped GaAs is doped with an n-type or p-type dopant.

4. A method as claimed in claim 3 in which the other material of the junction is TaN.

5. A method of measuring the RF power as claimed in claim 1 in which the RF power has a frequency in the range 2 GHz to 100 GHz.

6. A method as claimed in claim 5 in which the frequency range is 5 GHz to 70 GHz, preferably from 10 to 30 GHz.

7. A method of determining the RF power passing through a given position in a monolithic microwave integrated circuit (MMIC) which comprises the steps of integrating in the MMIC at least certain components of a voltage creating circuit, including a first Seebeck junction on the MMIC at said given position and a second Seebeck junction at a different position, measuring the voltage generated between the two junctions as a result of differential heating caused by the passage of the RF power through said first Seebeck junction and by calibration relating the RF power to a measured Seebeck voltage created when the circuit is in operation, wherein said first Seebeck junction is formed at a first junction of dissimilar conductors, and said second Seebeck junction is formed at a second junction of dissimilar conductors.

8. The method of claim 7, wherein said first Seebeck junction comprises a junction of a conductor of a first type and a conductor of a second type, and said second Seebeck junction comprises a junction of a conductor of said first type and a conductor of said second type.

9. The method of claim 8, wherein said conductor of said first type has a thermoelectric coefficient that differs from a thermoelectric coefficient of said conductor of said second type.

10. A method of determining the RF power passing through a given position in a monolithic microwave integrated circuit (MMIC) which comprises the steps of establishing on the MMIC at least certain components of a voltage creating circuit, including a first Seebeck junction on the MMIC at said given position and a second Seebeck junction at a different position, measuring the voltage generated between the two junctions as a result of differential heating caused by the passage of the RF power through said given position and by calibration relating the RF power to a measured Seebeck voltage created when the circuit is in operation, wherein the MMIC is an InP MMIC.

11. A method as claimed in claim 10 in which the second Seebeck junction and the first Seebeck junction are on the same isotherm when the RF power at the given point is zero.

12. A method as claimed in claim 10 in which the RF power has a frequency in the range 2 GHz to 100 GHz.

13. A method as claimed in claim 12 in which the frequency range is 5 GHz to 70 GHz, preferably from 10 to 30 GHz.

14. A monolithic microwave integrated circuit (MMIC) which comprises at least certain components of a voltage creating circuit, including a pair of Seebeck junctions comprising a first Seebeck junction integrated in the MMIC at a given position and a second Seebeck junction at a different position, a voltmeter for measuring the voltage generated between the two junctions as a result of differential heating caused by the passage of RF power through said first Seebeck junction to determine the RF power passing through said given position by calibration relating the RF power to a measured Seebeck voltage created when the circuit is in operation, wherein the Seebeck junctions are junctions of dissimilar conductors.

15. An MMIC as claimed in claim 14 in which the MMIC is based on GaAs.

16. An MMIC as claimed in claim 14, further comprising at least an additional pair of Seebeck junctions to increase the voltage created.

17. An MMIC as claimed in claim 14, wherein the MMIC is InP.

18. An MMIC as claimed in claim 17, wherein the other material of the junction is TaN.

19. An MMIC as claimed in claim 14, wherein said dissimilar conductors comprise a first conductor made from a first metal alloy, and a second conductor made from a second metal alloy.

20. A monolithic microwave integrated circuit (MMIC) which comprises at least certain components of a voltage creating circuit, including a pair of Seebeck junctions comprising a first Seebeck junction integrated in the MMIC at a given position and a second Seebeck junction at a different position, a voltmeter for measuring the voltage generated between the two junctions as a result of differential heating caused by the passage of RF power through said first Seebeck junction to determine the RF power passing through said given position by calibration relating the RF power to a measured Seebeck voltage created when the circuit is in operation, wherein the MMIC is an InP MMIC.

* * * * *